United States Patent [19]

Borland

[11] Patent Number: 5,501,993

[45] Date of Patent: Mar. 26, 1996

[54] METHOD OF CONSTRUCTING CMOS VERTICALLY MODULATED WELLS (VMW) BY CLUSTERED MEV BILLI (BURIED IMPLANTED LAYER FOR LATERAL ISOLATION) IMPLANTATION

[75] Inventor: John O. Borland, South Hamilton, Mass.

[73] Assignee: Genus, Inc., Sunnyvale, Calif.

[21] Appl. No.: 343,116

[22] Filed: Nov. 22, 1994

[51] Int. Cl.$^6$ ............................................. H01L 21/8238
[52] U.S. Cl. .................... 437/34; 437/154; 437/931
[58] Field of Search ........................... 437/34, 149, 150, 437/154, 931; 148/DIG. 157

[56] References Cited

U.S. PATENT DOCUMENTS 4,710,477  12/1987  Chen ........................................ 437/34
5,160,996  11/1992  Odanaka ................................. 257/375
5,384,279   1/1995  Stolmeijer et al. ..................... 437/34

OTHER PUBLICATIONS

Diffusion/Implantation, Dec. 1993 "MeV Implantation Technology Next–generation manufacturing with current–generation equipment" John Ogawa Borland, Ron Koelsch. brochure pp. 1–8.

Fowler, "MosFet Devices with high–gate dielectric integrity", IBM TDB, vol. 17, No. 1, Jun. 1974.

Primary Examiner—Chandra Chaudhari
Attorney, Agent, or Firm—Nields & Lemack

[57]  ABSTRACT

CMOS vertically modulated wells are constructed by using clustered MeV ion implantation to form a structure having a buried implanted layer for lateral isolation.

21 Claims, 5 Drawing Sheets

METHOD OF CONSTRUCTING CMOS VERTICALLY MODULATED WELLS (VMW) BY CLUSTERED MEV BILLI (BURIED IMPLANTED LAYER FOR LATERAL ISOLATION) IMPLANTATION

BACKGROUND OF THE INVENTION

1. Field of the Invention

The present invention relates to simplification of a manufacturing process for complementary semiconductor devices, which are becoming increasingly miniaturized and increasingly complex, to a high component-density semiconductor device having enhanced resistance to CMOS latch-up, and to well formation (single, twin, triple).

2. Description of the Related Art

The importance of CMOS technology in the VSLI field has grown, as a result of requirements for a high noise margin and low power consumption. However, as miniaturization has increased, serious problems have arisen with regard to preventing stray thyristor operation which causes the CMOS latch-up phenomenon to occur between mutually adjacent portions of an n-channel MOSFET and p-channel MOSFET, and with regard to maintaining a sufficient level of withstanding voltage between mutually adjacent elements.

Various forms of device configuration and manufacturing process have been proposed for overcoming these problems. These proposals include the use of a configuration containing wells, formation of a buried high concentration layer, and formation of a self-aligned channel stop at the edge of a well region.

Summaries of these various structures and methods have been presented, for example, in U.S. Pat. No. 5,160,996 at column 1 line 34 et seq. Additional disclosure of this technology appears in the article entitled "MeV implantation technology: Next-generation manufacturing with current-generation equipment" by Borland and Koelsch in the December 1993 issue of Solid State Technology.

SUMMARY OF THE INVENTION

The present invention solves the following problems:

1) single, twin and triple well CMOS process simplification:
   a) total number of steps
   b) 2–3 mask levels
   c) manufacturing time and cost reduction
   d) clustering well, isolation and channel implants, and $V_t$ implants
   e) clustering through a masking layer
2) clustered implant to reduce wafer handling, particles, process simplification
3) CMOS latch-up, SER, α-particle, GOI, and ESD
4) improved bulk wafer by hydrogen denuded zone
5) elimination of Epi for
   a) CMOS
   b) SOI wafer bonding
   c) CCD
6) oxygen related implant defects The foregoing problems are solved in the following manner
1) clustered implants up to six into one step
2) BILLI structure formation for latch-up and single, twin and triple well
3) Hydrogen denudation for improved Cz wafer and epi elimination The novel features of the invention include the following:
1) clustered implants
2) reduction in masks and process for twin and triple well
3) epi replacement for CMOS, SOI, CCD etc.
4) latch-up free
5) hydrogen passivation
6) oxygen-denuded-zone free
7) defect free
8) implant-related-defect free The features of the present invention may be summarized as follows:

1) CMOS semiconductor device manufacturing process simplification and cost reduction for NMOS and PMOS transistor fabrication:
   a) single n or p well formation on p- or n-substrates.
   b) twin/double n & p well formation on p- or n-substrates.
   c) triple well formation, surface n & p well plus buried n or p well on p- or n-substrate.
   d) Vt implant through a masking layer.
   e) clustered implants; deep retro-well implant/channel stop implant/Vt implant.
      deep retro p or n-well implant/channel stop implant.
      channel stop implant/Vt implant
      deep retro p or n-well implant/channel stop implant/Vt implant.
      deep retro p or n-well implant/channel stop implant/deep retro n or p-well implant/channel stop implant.
      p or n-well channel stop implant/Vt implant/n or p-well channel stop implant/Vt implant.
      deep retro p or n-well implant/channel stop implant/Vt implant/deep retro n or p-well implant/channel stop implant/Vt implant.
   f) clustered implants through a masking layer; deep retro-well implant/channel stop implant/Vt implant.
      deep retro p or n-well implant/channel stop implant.
      channel stop implant/Vt implant
      deep retro p or n-well implant/channel stop implant/Vt implant.
      deep retro p or n-well implant/channel stop implant/deep retro n or p-well implant/channel stop implant.
      p or n-well channel stop implant/Vt implant/n or p-well channel stop implant/Vt implant.
      deep retro p or n-well implant/channel stop implant/Vt implant/deep retro n or p-well implant/channel stop implant/Vt implant.
   g) elimination of 1 to 4 masking layers.
   h) elimination of up to 4 medium current implants and the associated implanters.
   i) improved high energy implanter utilization.
   j) improved high energy implanter productivity by 25%.
   k) cost savings of $25 to $149 per 200 mm wafer.
   l) reduction in masking layer thickness for high energy ion implantation.

2) Improved CMOS latch-up resistance and device scaling/shrink.
   a) reduction in lateral current gain/lateral beta ($B_L$).
   b) reduction in vertical current gain/vertical beta ($B_v$).
   c) reduction in well resistances ($R_W$).
   d) reduction in substrate resistance ($R_S$),
   e) improved n+ to p+ spacing.

3) Hydrogen denudation for improved Cz silicon wafer surface properties.

a) improved device performance
   gate oxide integrity
   oxide QBD
   junction leakage
   device yield
b) improved oxygen out diffusion
c) lower surface oxygen
d) lower surface defect level
e) equivalent to epi wafer surface quality
f) improved resistance to surface native oxide
g) improved wafer surface roughness
h) pre-process intrinsic gettering for high energy implant device processing
4) BILLI structure plus $H_2$ denudation= epi replacement
a) CMOS technology
b) CCD technology

BRIEF DESCRIPTION OF THE DRAWINGS

The invention may best be understood from the following detailed description thereof, having reference to the accompanying drawings, in which.

Jig. 2 is a schematic view of the steps involved in manufacturing a BILLI twin-well structure with two masks and clustered implantation.

Figure 1:
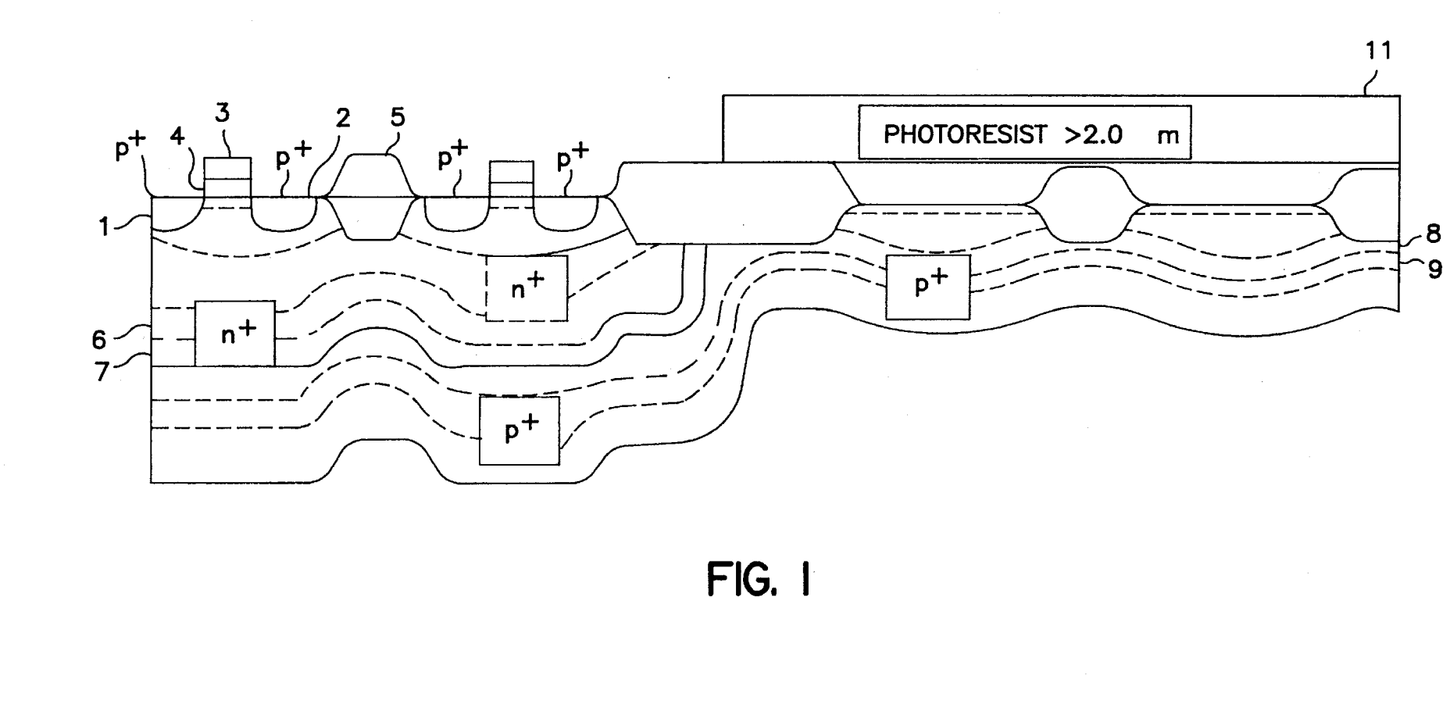
FIG. 1 is a schematic view of a BILLI structure in accordance with the invention.

Referring to the drawings, and first to FIG. 1 thereof, FIG. 1 shows a low cost MeV structure in accordance with the invention at the stage in its manufacture at which PMOS devices can be formed in a retrograde n-well and NMOS devices in a retrograde p-well. Although at this stage in its manufacture neither the PMOS devices nor the NMOS devices have been formed, in FIG. 1 PMOS devices are shown, in order to indicate where they will be formed in steps subsequent to said stage. Isolation areas 5 separate adjacent PMOS devices which can be implanted into a retrograde n-well formed in a p-type substrate 10. Adjacent to the series of PMOS devices in an n-well retrograde p-wells have been formed, into which a series of NMOS devices will be implanted in subsequent steps of manufacture. The retrograde n-well includes an upper layer 6 wherein phosphorus ions have been implanted so as to form phosphorus (n) impurity atoms with a density that is produced by 5E12cm-2] and a lower layer 7 wherein phosphorus ions have been implanted so as to form phosphorus (n) impurity atoms with a density that is produced by 3E13cm-2. The retrograde p-well includes an upper layer 8 wherein boron ions have been implanted so as to form boron (p) impurity atoms with a density that is produced by 5E12cm-2] and a lower layer 9 wherein boron ions have been implanted so as to form boron (p) impurity atoms with a density that is produced by 3E13cm-2. The term "upper layer" signifies the layer which is nearer the active surface of the substrate 10 and is 0.5 μm deep. The term "lower layer" signifies the layer which is farther from the active surface of the substrate 10 and is 1.2 μm deep. These are retrograde wells because the impurity-atom density is higher at the lower part of the well than at the upper part of the well.

The BILLI structure is formed by continuance of the boron layers from the depths at which they are formed beneath a thick masking layer, for example: comprising at least 2 μm of photoresist to the depths at which they are formed in the absence of the thick masking layer. The latter depths are under the retrograde n-well, deeper than both the upper layer 6 and the lower layer 7, and the layers at these depths are designated "buried". The boron layers at these depths thus form a "buried implanted layer for lateral isolation" or "BILLI" structure, since they surround the n-well around the sides and the bottom. This BILLI structure provides best latch-up resistance for miminum n+ to p+ spacing even over epi-wafers. When combined with hydrogen denudation, this BILLI structure on bulk Cz wafers can lead to epi replacement.

Figure 2:
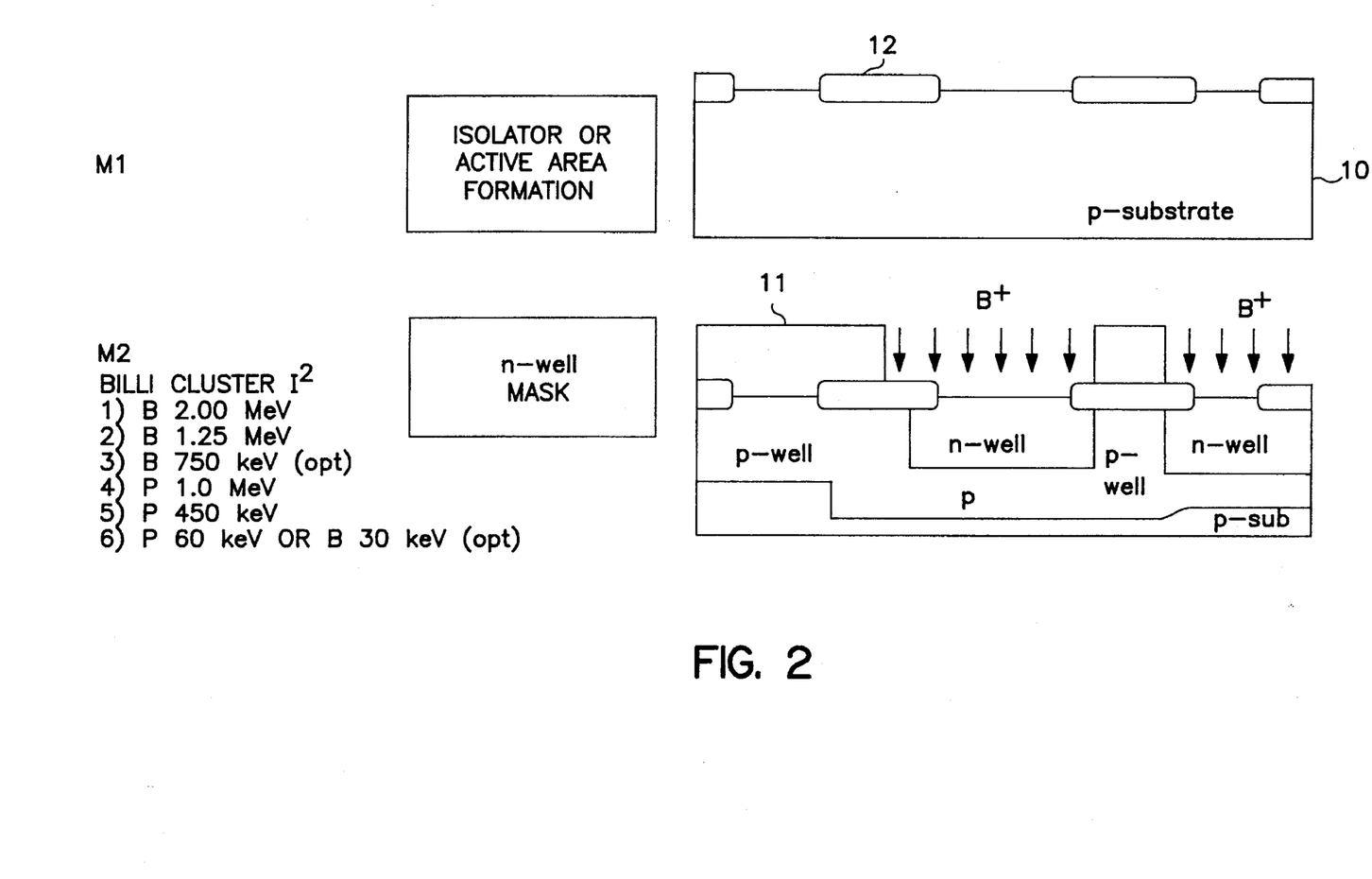

FIG. 2, in conjunction with FIG. 1, shows a method of forming the BILLI structure in accordance with the invention. This method of the invention not only has the advantage of resulting in the formation of the novel BILLI structure of the invention, but also results in both process simplification and cost reducton for single, twin and triple well formation. A preferred embodiment of the method of the invention comprehends the following steps. First, isolation areas 12 are formed (or, alternatively, active areas are formed) in the substrate 10. Then a mask 11, such as a photoresist mask having a thickness of more than 2.0 μm is placed on the surface as shown to block the phosphorus ions of maximum energy, and a clustered series of four to six implants are carried out.

The clustered series of four to six implants may be carried out as follows: First, boron ions are directed onto the upper surface of the substrate 10 with an energy of 2.00 MeV, thereby forming the lower layer 9 of p-type material (deep retrograde p-well). Second, without removing the substrate 10 from the vacuum chamber in which it was irradiated with boron ions, the parameters of the ion accelerator are changed, and boron ions are directed onto the upper surface of the substrate 10 with an energy of 1.25 MeV, thereby forming the upper layer 8 of p-type material (channel stop implant or shallow retrograde p-well). As an optional third step, without removing the substrate 10 from the vacuum chamber in which it was irradiated with boron ions, the parameters of the ion accelerator are changed, and boron ions are directed onto the upper surface of the substrate 10 with an energy of 750 keV, thereby forming a shallow, thin threshhold voltage layer $V_t$ at the surface of the retrograde p-well 8,9. Fourth, without removing the substrate 10 from the vacuum chamber in which it was irradiated with boron ions, the parameters of the ion accelerator are changed, and phosphorus ions are directed onto the upper surface of the substrate 10 with an energy of 1 MeV, thereby forming the lower layer 7 of n-type material (deep retrograde n-well). Fifth, without removing the substrate 10 from the vacuum chamber in which it was irradiated with boron ions and phosphorus ions, the parameters of the ion accelerator are changed, and phosphorus ions are directed onto the upper surface of the substrate 10 with an energy of 450 keV, thereby forming the upper layer 6 of n-type material (channel stop implant or shallow retrograde n-well). As an optional sixth step, without removing the substrate 10 from the vacuum chamber in which it was irradiated with boron ions and phosphorus ions, the parameters of the ion accelerator are changed, and phosphorus ions are directed onto the upper surface of the substrate 10 with an energy of 60 keV, thereby forming a shallow, thin threshhold voltage layer $V_t$ at the surface of the retrograde n-well 6,7. Alternatively, the sixth step may comprise directing boron ions onto the upper surface of the substrate 10 with an energy of 30 keV so as to form this threshhold voltage layer.

The method of FIG. 2 may be modified by omitting the two optional steps and, in lieu thereof, carrying out a medium current blanket Vt implant after the M1 step and before the M2 step. Alternatively, the sixth step may be omitted and, in lieu thereof, a medium current blanket Vt implant may be carried out after the M1 step and before the M2 step.

Figure 3:
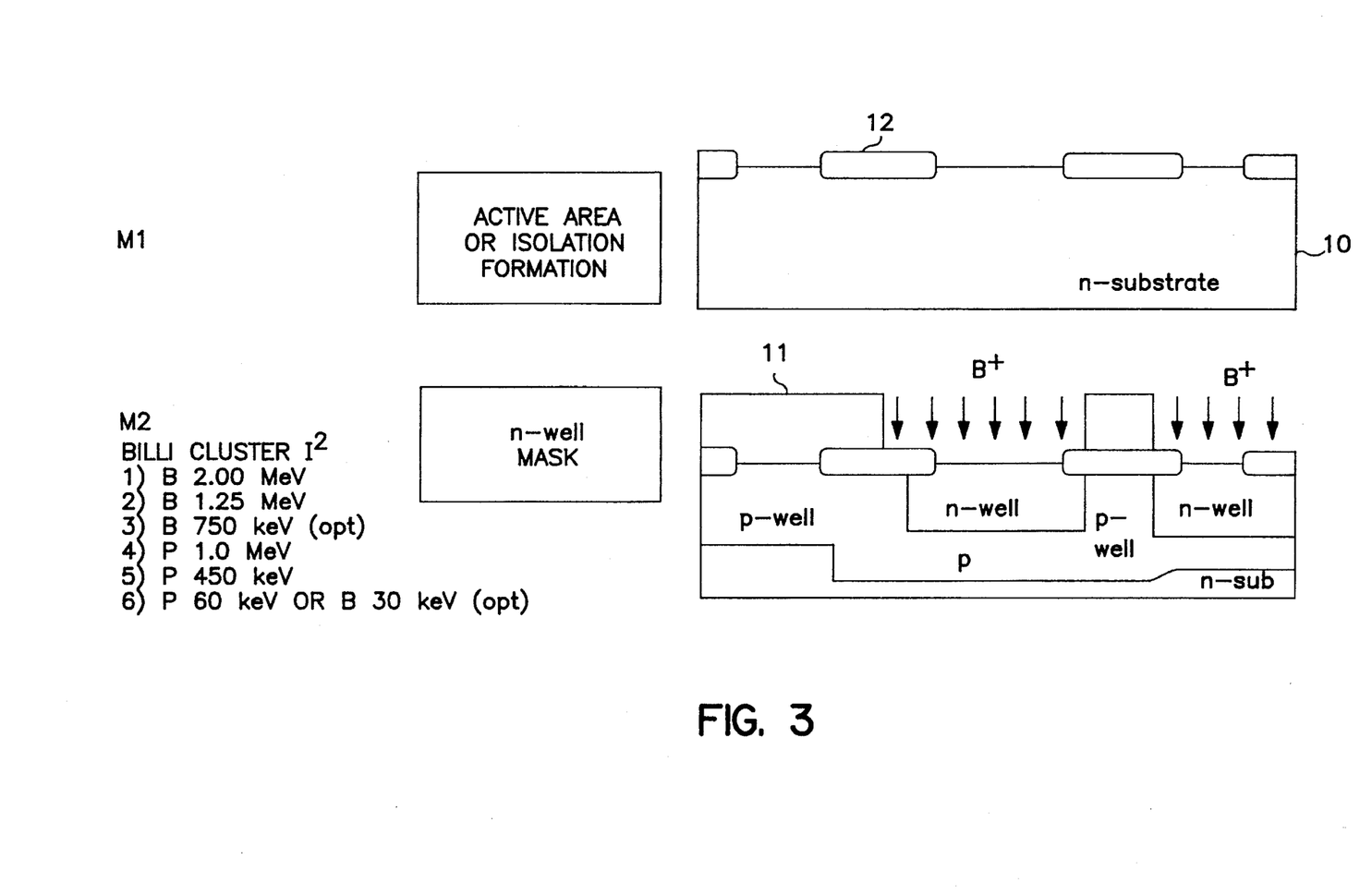
FIG. 3 is a schematic view of the steps involved in manufacturing a BILLI triple-well structure with two masks and clustered implantation.

As shown in FIG. 3, if the steps carried out in the method of FIG. 2 are applied to an n-type substrate, a BILLI triple well structure is formed. Alternatively, a BILLI triple well structure may be formed by the clustered implantation indicated in FIG. 4, wherein the implantation steps are carried out on a p-type substrate in the following sequence.

Figure 4:
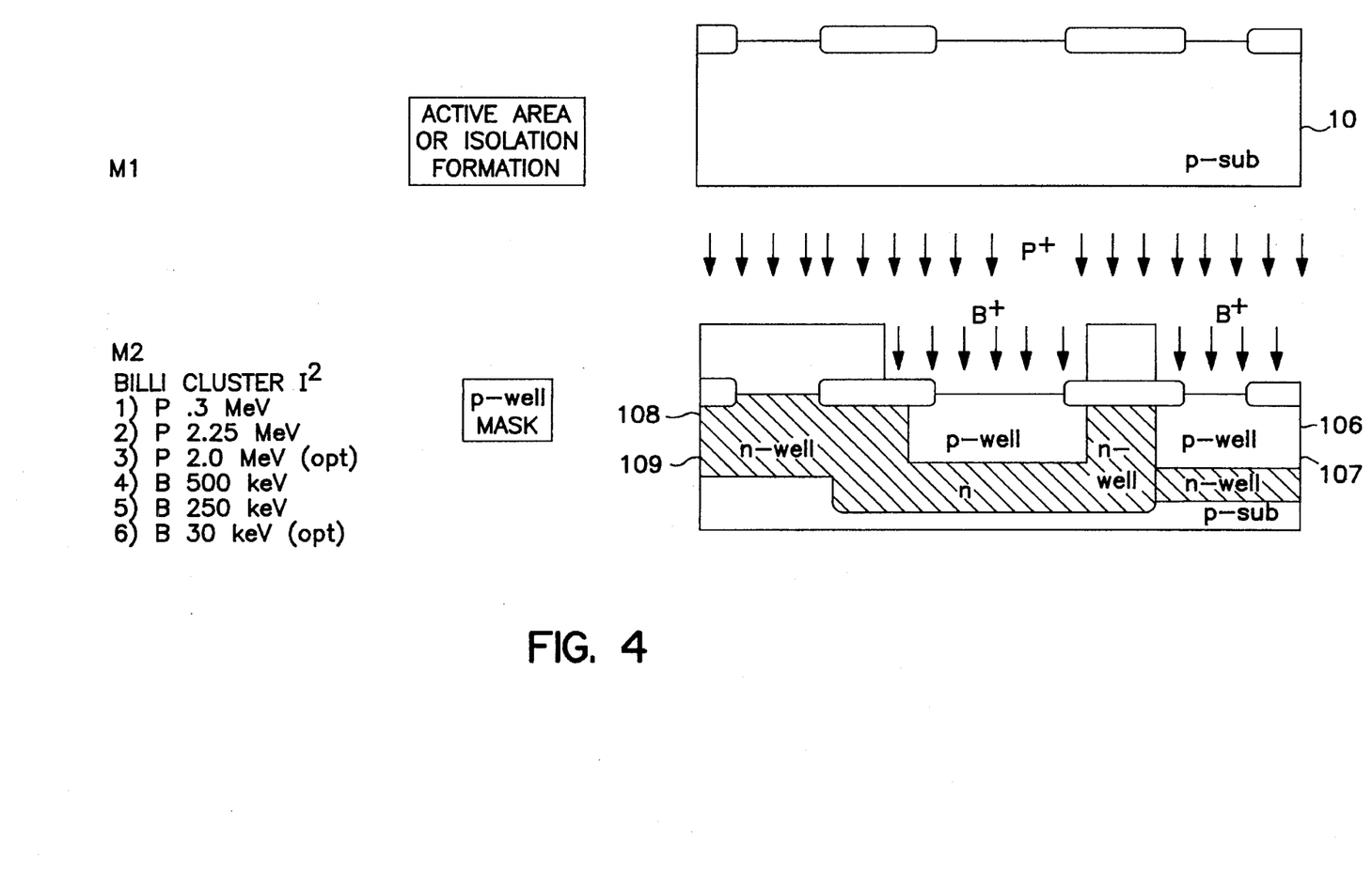
FIG. 4 is a schematic view showing an alternative process to that of FIG. 3.

First, phosphorus ions are directed onto the upper surface of the substrate 110 with an energy of 3.0 MeV, thereby forming the lower layer 109 of n-type material. Second, without removing the substrate 110 from the vacuum chamber in which it was irradiated with phosphorus ions, the parameters of the ion accelerator are changed, and phosphorus ions are directed onto the upper surface of the substrate 110 with an energy of 2.25 MeV, thereby forming the upper layer 108 of n-type material. As an optional third step, without removing the substrate 10 from the vacuum chamber in which it was irradiated with phosphorus ions, the parameters of the ion accelerator are changed, and phosphorus ions are directed onto the upper surface of the substrate 110 with an energy of 2.0 MeV, thereby forming a shallow, thin threshhold voltage layer $V_t$ at the surface of the retrograde n-well 108,109. Fourth, without removing the substrate 110 from the vacuum chamber in which it was irradiated with phosphorus ions, the parameters of the ion accelerator are changed, and boron ions are directed onto the upper surface of the substrate 110 with an energy of 500 keV, thereby forming the lower layer 107 of p-type material. Fifth, without removing the substrate 110 from the vacuum chamber in which it was irradiated with phosphorus ions and boron ions, the parameters of the ion accelerator are changed, and boron ions are directed onto the upper surface of the substrate 110 with an energy of 250 keV, thereby forming the upper layer 106 of p-type material. As an optional sixth step, without removing the substrate 110 from the vacuum chamber in which it was irradiated with phosphorus ions and boron ions, the parameters of the ion accelerator are changed, and boron ions are directed onto the upper surface of the substrate 110 with an energy of 30 keV, thereby forming a shallow, thin threshhold voltage layer $V_t$ at the surface of the retrograde p-well 106,107.

Figure 5:
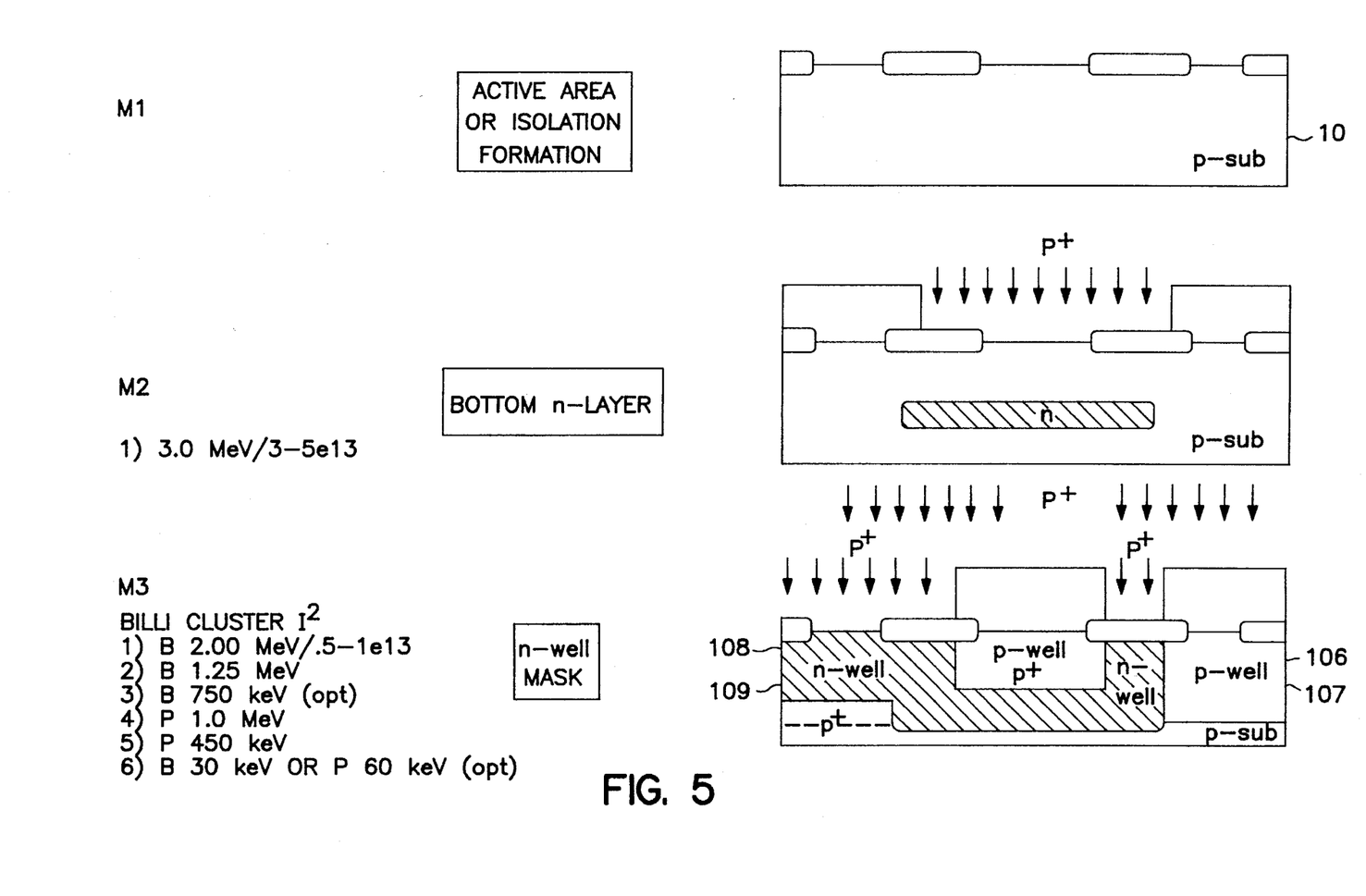
FIG. 5 is a schematic view showing another alternative process to that of FIG. 3.

Alternatively, a BILLI triple well structure may be formed by the clustered implantation indicated in FIG. 5, wherein the bottom ("buried") n-layer is formed prior to the clustered implant steps by a separate implantation of 3.0 MeV phosphorus ions at a current of 3 to 5 E13 through a separate mask, designated "M2" in FIG. 5. The remaining, clustered implantation steps are carried out through a separate mask, designated "M3" in FIG. 5, in the following sequence.

First, boron ions are directed onto the upper surface of the substrate 110 with an energy of 2.0 MeV and a dose of 0.5 to 1 E13, thereby forming the lower layer 107 of p-type material in the p-wells. Second, without removing the substrate 110 from the vacuum chamber in which it was irradiated with boron ions, the parameters of the ion accelerator are changed, and boron ions are directed onto the upper surface of the substrate 110 with an energy of 1.25 MeV, thereby forming the upper layer 106 of p-type material in the p-wells. As an optional third step, without removing the substrate 110 from the vacuum chamber in which it was irradiated with boron ions, the parameters of the ion accelerator are changed, and boron ions are directed onto the upper surface of the substrate 110 with an energy of 750 keV, thereby forming a shallow, thin threshhold voltage layer $V_t$ at the surface of the retrograde p-well 106,107. Fourth, without removing the substrate 110 from the vacuum chamber in which it was irradiated with boron ions, the parameters of the ion accelerator are changed, and phosphorus ions are directed onto the upper surface of the substrate 110 with an energy of 1.0 MeV, thereby forming the lower layer 109 of n-type material. Fifth, without removing the substrate 110 from the vacuum chamber in which it was irradiated with boron ions and phosphorus ions, the parameters of the ion accelerator are changed, and phosphorus ions are directed onto the upper surface of the substrate 110 with an energy of 450 keV, thereby forming the upper layer 108 of n-type material. As an optional sixth step, without removing the substrate 110 from the vacuum chamber in which it was irradiated with boron ions and phosphorus ions, the parameters of the ion accelerator are changed, and boron ions are directed onto the upper surface of the substrate 110 with an energy of 30 keV, thereby forming a shallow, thin threshhold voltage layer $V_t$ at the surface of the retrograde n-well 106,107. Alternatively, the sixth step may comprise directing phosphorus ions onto the upper surface of the substrate 110 with an energy of 60 keV so as to form this threshhold voltage layer.

In the foregoing description of clustered implantation, the sequence of clustered implantions are carried out by the same ion accelerator. However, if many ion accelerators are available at the same installation, the sequence of clustered implantations may be carried out by separate ion accelerators without departing from the spirit and scope of the invention; it is only necessary to ensure that the same mask is used throughout the sequence of clustered implantations.

Also, in the foregoing description of clustered implantation, representative thicknesses of the masks are set forth, and representative energies of the ions being implanted are set forth. However, the invention is not limited to such thicknesses or energies, and the invention comprehends, in general, phosphorus-ion energies which are insufficient to pass through the mask involved, thus being blocked by the mask, and boron-ion energies which are sufficient to pass through the mask involved.

Additional advantages of the invention are achieved if the implantation and masking steps hereinbefore set forth are carried out on a substrate the surface whereof has been subjected to hydrogen annealing. The resultant hydrogen denudation provides an improved Cz wafer and can eliminate epi. Using the BILLI structure in combination with hydrogen denudation for epi replacement results in epi equivalent thin gate oxide quality, excellent junction leakage, improved resistance to RCA wet clean related surface micro-defect formation, improved surface smoothness and very low surface oxygen and defect levels.

In the foregoing description the invention has been described in terms of boron ions and phosphorus ions. However, the invention includes the use of p-type dopants other than boron in lieu of boron ions, as well as the use of n-type dopants other than phosphorus in lieu of phosphorus ions.

Having thus described the principles of the invention, together with several illustrative embodiments thereof, it is to be understood that, although specific terms are employed, they are used in a generic and descriptive sense, and not for purposes of limitation, the scope of the invention being set forth in the following claims.

I claim:

1. That method of manufacturing a semiconductor device comprising the following steps:

applying a first mask forming isolation or active areas removing the first mask and applying a second mask placing the wafer in a treatment chamber performing a clustered series of irradiation steps while the wafer remains in said treatment chamber and before said wafer is removed therefrom each of which comprises irradiating said wafer through said second mask with ions of a conductivity type and an energy, wherein the energy of the ions in any one irradiation step differs from that in the other irradiation steps, and wherein the energy of the ions in one of the irradiation steps is higher than that in the other irradiation steps.

2. Method in accordance with claim 1 wherein at least one of said irradiation steps comprises irradiating with ions of a first conductivity type and at least one other of said irradiation steps comprises irradiating with ions of a second conductivity type.

3. Method in accordance with claim 2 wherein at least two of said irradiation steps comprises irradiating with ions of a first conductivity type.

4. Method in accordance with claim 2 wherein said device has a substrate of a first conductivity type and the ions in said irradiation step having ions with an energy higher than that in the other irradiation steps are of said first conductivity type, while the lower energy ions are of opposite conductivity type, so that a twin-well structure is formed.

5. Method in accordance with claim 3 wherein said device has a substrate of a first conductivity type and the ions in said irradiation step having ions with an energy higher than that in the other irradiation steps are of the opposite conductivity type, while the lower energy ions are of substrate conductivity type, so that a triple-well structure is formed wherein both surface twin wells are isolated from the substrate.

6. That method of manufacturing a semiconductor device comprising the following steps:

forming isolation areas or active areas in a surface of a substrate, placing a mask on said surface, and carrying out a clustered series of four to six implants, said clustered series of four to six implants being carried out as follows:

first, directing p-type ions onto said surface with a first energy sufficient to penetrate said mask and sufficient to form a first retrograde p-well, second, directing p-type ions onto said surface with a second energy less than said first energy but sufficient to penetrate said mask and sufficient to form a channel stop implant or second retrograde p-well which is shallower than the first retrograde p-well, as an optional third step, directing p-type ions onto said surface with a third energy less than said second energy but sufficient to penetrate said mask and sufficient to form a threshhold voltage layer $V_t$ at the surface of the retrograde p-well, fourth, directing n-type ions onto said surface with a fourth energy insufficient to penetrate said mask but sufficient to form a first retrograde n-well, and fifth, directing n-type ions onto said surface with a fifth energy less than said fourth energy but sufficient to form a channel stop implant or second retrograde n-well which is shallower than the first retrograde n-well.

7. A method according to claim 6 including, as a sixth step, the step of directing n-type ions onto said surface with an energy less than said fifth energy but sufficient to form a threshhold voltage layer $V_t$ at the surface of the retrograde n-well.

8. A method according to claim 6 including, as a sixth step, the step of directing p-type ions onto the upper surface of the substrate with an energy less than said fifth energy but sufficient to form a threshhold voltage layer $V_t$ at the surface of the retrograde n-well.

9. That method of manufacturing a semiconductor device having a twin-well structure on a p-substrate comprising the following steps:

forming isolation areas or active areas in a surface of a substrate, carrying out a blanket Vt implant, placing a mask on said surface, and carrying out a clustered series of four to six implants, said clustered series of four to six implants being carried out as follows:

first, directing p-type ions onto said surface with a first energy sufficient to penetrate said mask and sufficient to form a first retrograde p-well, second, directing p-type ions onto said surface with a second energy less than said first energy but sufficient to penetrate said mask and sufficient to form a channel stop implant or second retrograde p-well which is shallower than the first retrograde p-well, third, directing n-type ions onto said surface with a third energy insufficient to penetrate said mask but sufficient to form a first retrograde n-well, and fourth, directing n-type ions onto said surface with a fourth energy less than said third energy but sufficient to form a channel stop implant or second retrograde n-well which is shallower than the first retrograde n-well.

10. A method according to claim 7 wherein said optional third step is carried out and there is also carried out the step of carrying out a blanket Vt implant after the step of forming isolation areas or active areas and before placing said mask on said surface.

11. A method according to claim 6, wherein said substrate is p-type and a twin-well structure is formed.

12. A method according to claim 6, wherein said substrate is n-type and a triple-well structure is formed.

13. That method of manufacturing a semiconductor device having a twin-well structure on an n-substrate comprising the following steps:

forming isolation areas or active areas in a surface of an n-type substrate 110, placing a mask on said surface, and carrying out a clustered series of four to six implants, said clustered series of four to six implants being carried out as follows:

first, directing n-type ions onto said surface with a first energy sufficient to penetrate said mask and sufficient to form a lower layer 109 of n-type material, so that a retrograde n-well 108,109 is formed, second, directing n-type ions onto said surface with a second energy less than said first energy but sufficient to penetrate said mask and sufficient to form an upper layer 108 of n-type material, so that a channel stop is formed, as an optional third step, directing n-type or p-type ions onto said surface with a third energy less than said second energy but sufficient to penetrate said mask and sufficient to form a threshhold voltage layer $V_t$ at the surface of the retrograde n-well 108,109, fourth, directing p-type ions onto said surface with a fourth energy insufficient to penetrate said mask but sufficient to form a lower layer 107 of p-type material, so that a retrograde p-well 106,107 is formed, fifth, directing p-type ions onto said surface with a fifth energy less than said fourth energy but sufficient to form an upper layer 106 of p-type material, so that a channel stop is formed, and, as an optional sixth step, directing p-type ions onto said surface with a sixth energy less than said fifth energy but sufficient to form a threshhold voltage layer $V_t$ at the surface of the retrograde p-well 106,107.

14. That method of manufacturing a semiconductor device having a triple-well structure comprising the following steps:

forming isolation areas or active areas in a surface of a p-type substrate 110, placing a first mask on said surface, said mask having at least one aperture, directing n-type ions onto said surface with a first energy insufficient to penetrate said first mask and sufficient to form a buried n-layer underneath said aperture, removing said first mask and placing a second (n-well) mask on said surface, said mask having at least one solid portion and having a thickness sufficient to block the maximum energy of n-type ions, said second mask being placed so that said solid portion is above said buried n-layer, and carrying out a clustered series of four to six implants, said clustered series of four to six implants being carried out as follows:

first, directing p-type ions onto said surface with a second energy sufficient to penetrate said second mask and sufficient to form a lower layer 107 of p-type material so that a retrograde p-well is formed, but at a dose not to compensate the buried n-layer, second, directing p-type ions onto said surface with a third energy less than said second energy and sufficient to form an upper layer 106 of p-type material so that a channel stop is formed in the p-wells, as an optional third step, directing p-type ions onto said surface with a fourth energy less than said third energy and sufficient to form a threshhold voltage layer $V_t$ at the surface of the retrograde p-well 106,107, fourth, directing n-type ions onto said surface with a fifth energy insufficient to penetrate said second mask but sufficient to form a lower layer 109 of n-type material, so that a retrograde n-well is formed, and fifth, directing n-type ions onto said surface with a sixth energy insufficient to penetrate said second mask but sufficient to form an upper layer 108 of n-type material so that a channel stop is formed.

15. A method according to claim 14, wherein, as a sixth step, there is carried out the step of directing p-type ions onto said surface with an energy less than that of said fifth step but sufficient to form a threshhold voltage layer $V_t$ at the surface of the retrograde n-well 108,109.

16. A method according to claim 14, wherein, as a sixth step, there is carried out the step of directing n-type ions onto the surface of the substrate 110 with an energy less than that of said fifth step but sufficient to form a threshhold voltage layer $V_t$ at the surface of the retrograde n-well 108,109.

17. A method according to claim 6 wherein, prior to said forming step, inert ambient annealing/denuding is performed on said surface to delete oxygen and defects from the surface region.

18. Method in accordance with claim 1, including carrying out a blanket $V_t$ implant after the step of removing the first mask and before the step of applying the second mask.

19. Method in accordance with claim 1, including removing the second mask after said clustered series of irradiation steps and thereafter carrying out a blanket $V_t$ implant.

20. That method of manufacturing a semiconductor device having a twin-well structure on a p-substrate comprising the following steps:

forming isolation areas or active areas in a surface of a substrate, placing a mask on said surface, and carrying out a clustered series of four to six implants, said clustered series of four to six implants being carried out as follows:

first, directing p-type ions onto said surface with a first energy sufficient to penetrate said mask and sufficient to form a first retrograde p-well, second, directing p-type ions onto said surface with a second energy less than said first energy but sufficient to penetrate said mask and sufficient to form a channel stop implant or second retrograde p-well which is shallower than the first retrograde p-well, third, directing n-type ions onto said surface with a third energy insufficient to penetrate said mask but sufficient to form a first retrograde n-well, fourth, directing n-type ions onto said surface with a fourth energy less than said third energy but sufficient to form a channel stop implant or second retrograde n-well which is shallower than the first retrograde n-well, and fifth, removing said mask and thereafter carrying out a blanket $V_t$ implant.

21. A method according to claim 7 wherein said optional third step is carried out and there is also carried out, as a seventh step and an eighth step, respectively, the step of removing said mask and the step of carrying out a blanket $V_t$ implant.

* * * * *